US008207669B2

(12) United States Patent
Lee et al.

(10) Patent No.: US 8,207,669 B2
(45) Date of Patent: Jun. 26, 2012

(54) ORGANIC LIGHT EMITTING DISPLAY DEVICE INCLUDING SPACERS AND FILLERS

(75) Inventors: So-Young Lee, Yongin (KR);
Sun-Young Lee, Yongin (KR);
Yoon-Hyeung Cho, Yongin (KR);
Min-Ho Oh, Yongin (KR); Byoung-Duk Lee, Yongin (KR); Jong-Hyuk Lee, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 191 days.

(21) Appl. No.: 12/467,936

(22) Filed: May 18, 2009

(65) Prior Publication Data

US 2010/0140595 A1   Jun. 10, 2010

(30) Foreign Application Priority Data

Dec. 8, 2008   (KR) .................. 10-2008-0123827

(51) Int. Cl.
*H01J 1/62*      (2006.01)
*H01J 63/04*     (2006.01)

(52) U.S. Cl. ........ 313/512; 313/483; 313/500; 313/501; 313/502; 313/503; 313/504; 313/505; 313/506; 313/510

(58) Field of Classification Search .................. None
See application file for complete search history.

(56) References Cited

U.S. PATENT DOCUMENTS 7,026,658 B2 * 4/2006 Park et al. .................. 257/98
2008/0213514 A1 * 9/2008 Kim et al. .................. 428/1.53

FOREIGN PATENT DOCUMENTS

| JP | 2005-158617 | 6/2005 |
| KR | 10-2004-0080729 A | 9/2004 |
| KR | 10-2006-0023271 | 3/2006 |
| KR | 10-2007-0075921 | 7/2007 |
| KR | 10-2008-0000974 | 1/2008 |

OTHER PUBLICATIONS

English machine translation of Kim (KR 2007-075921).*
English machine translation of Yamashita et al (2005-158617).*
KIPO Office action dated May 31, 2010, for priority Korean Patent Application No. 10-2008-0123827, as well as KR 10-2007-0075921 previously filed dated Mar. 9, 2010.
KIPO Office action dated Jan. 26, 2010, for priority Korean application 10-2008-0123827.

* cited by examiner

*Primary Examiner* — Natalie Walford
(74) *Attorney, Agent, or Firm* — Christie, Parker & Hale, LLP

(57) ABSTRACT

An organic light emitting display device includes a first substrate, a plurality of organic light emitting devices on the first substrate, a second substrate arranged opposite and substantially parallel to the first substrate with the organic light emitting devices therebetween, a plurality of spacers between the organic light emitting devices and the second substrate, and a plurality of fillers alternately arranged with the spacers and configured to fill in space between the first substrate and the second substrate, wherein at least portions of the spacers overlap with a plurality of light emitting regions corresponding to the organic light emitting devices. The spacers and fillers are composed of transparent materials having refractive indexes similar to each other so that visibility and image quality are not lowered and the distance between the substrates is substantially constant.

12 Claims, 6 Drawing Sheets

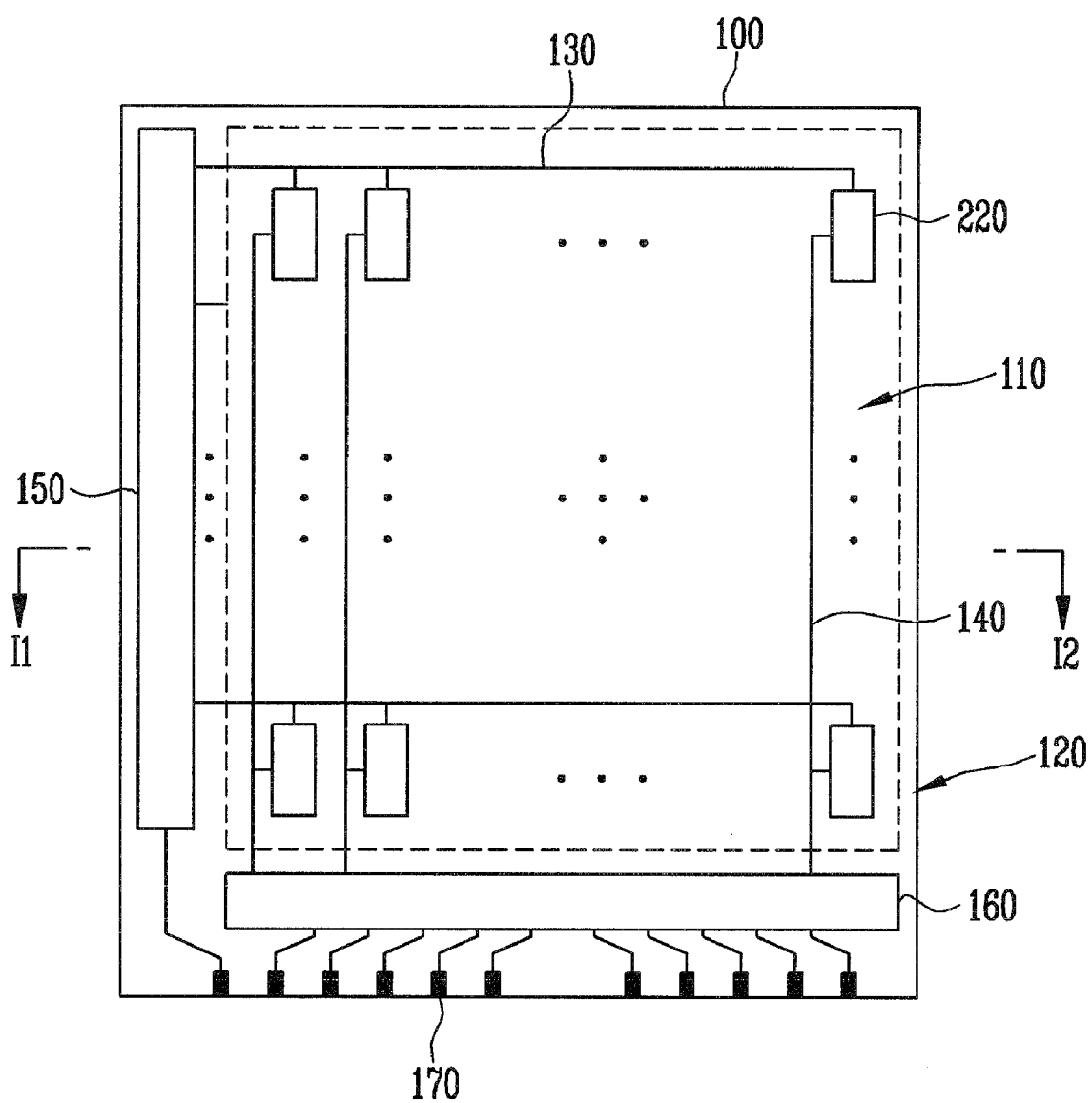

ORGANIC LIGHT EMITTING DISPLAY DEVICE INCLUDING SPACERS AND FILLERS

CROSS-REFERENCE TO RELATED APPLICATIONS

This application claims priority to and the benefit of Korean Patent Application No. 10-2008-0123827, filed on Dec. 8, 2008, in the Korean Intellectual Property Office, the entire content of which is incorporated herein by reference.

BACKGROUND OF THE INVENTION

1. Field of the Invention

The present invention relates to an organic light emitting display device.

2. Description of Related Art

An organic light emitting display device, a next generation display that features self-light emission, has excellent viewing angle, contrast, response speed and power consumption, and is thinner, lighter and simpler than a liquid crystal display device (LCD), Such an organic light emitting display device has been spotlighted as a display for a portable terminal, a telephone, a computer, a game machine, etc., due to these features.

An organic light emitting display device includes organic light emitting devices constituting pixels located at crossings of scan lines and data lines in a matrix. The organic light emitting device includes an anode electrode, a cathode electrode and an organic thin film layer formed between the anode electrode and the cathode electrode, and includes a hole transport layer, an organic light emitting layer, and an electron transport layer, when a predetermined voltage is applied to the anode electrode and the cathode electrode, holes injected through the anode electrode and electrons injected through the cathode electrode are re-combined in the light emitting layer, thereby emitting light due to an energy difference generated during the process.

The conventional organic light emitting device includes organic material and metal electrodes such that luminescent properties deteriorate and electrodes are oxidized or stripped if exposed to oxygen or moisture in the air. Therefore, in order to prevent this, a sealing technique using a sealing substrate to seal the organic light emitting device is used.

However, with such a sealing technique, the sealing substrate is arranged to be parallel to the substrate on which the organic light emitting device is formed so that as the display device increases in size, the display device further droops due to its weight such that the sealing substrate contacts the organic light emitting device or an image distortion occurs.

SUMMARY OF THE INVENTION

In an embodiment according to the present invention, an organic light emitting display device having a uniform interval between substrates and having high impact resistance is provided.

In another embodiment according to the present invention, an organic light emitting display device capable of easily arranging substrates during the manufacturing process thereof is provided.

An embodiment according to the present invention provides an organic light emitting display device comprising a first substrate, a plurality of organic light emitting devices on the first substrate, a second substrate arranged opposite and substantially parallel to the first substrate with the organic light emitting devices therebetween, a plurality of spacers between the organic light emitting devices and the second substrate, and a plurality of fillers alternately arranged with the spacers and configured to fill in space between the first substrate and the second substrate, wherein at least portions of the spacers overlap with a plurality of light emitting regions corresponding to the organic light emitting devices. The spacers and fillers may be composed of transparent insulating materials having a transmittance between about 70 to 100%, and the difference in a refractive index between the spacers and the fillers is preferably 0.4 or less.

The thin film transistor may include a semiconductor layer including a source region, a drain region and a channel region, a gate electrode insulated from the semiconductor layer by a gate insulating layer, and a source electrode coupled to the source region of the semiconductor layer and a drain electrode coupled to the drain region of the semiconductor layer, wherein one of the source electrode or the drain electrode is coupled to an associated one of the first electrodes.

BRIEF DESCRIPTION OF THE DRAWINGS

The accompanying drawings, together with the specification, illustrate exemplary embodiments of the present invention, and, together with the description, serve to explain the principles of the present invention.

FIG. 1 is a schematic plan view of an organic light emitting display device according to an embodiment of the present invention;

DETAILED DESCRIPTION

Figure 2A:
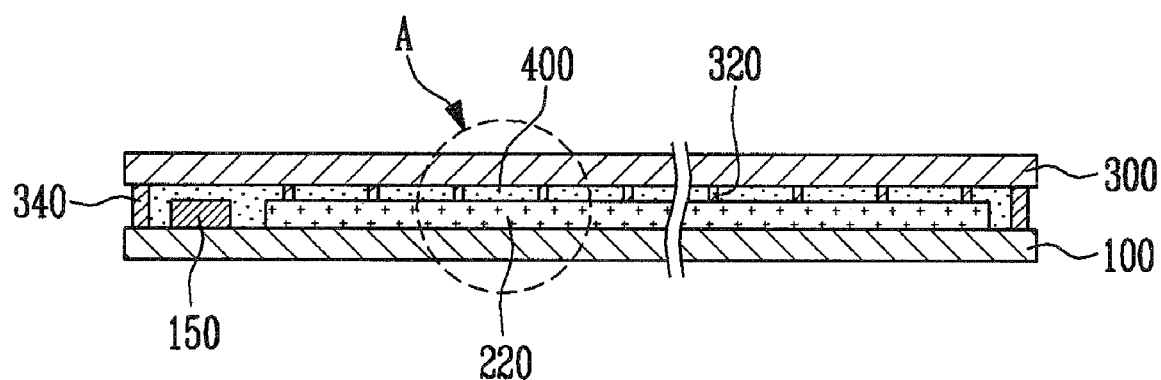
FIG. 2A is a simplified schematic cross-sectional view taken along the line I1-I2 of the organic light emitting display device of FIG. 1 according to an embodiment of the present invention.

In the following detailed description, certain exemplary embodiments of the present invention have been shown and described, by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" or "coupled to" another element, it can be directly connected to or coupled to the element, respectively or be indirectly connected to or coupled to the element, respectively with one or more intervening elements interposed therebetween. Hereinafter, like reference numerals refer to like elements.

Hereinafter, exemplary embodiments of the present invention will be described in more detail with reference to the accompanying drawings.

Figure 2B:
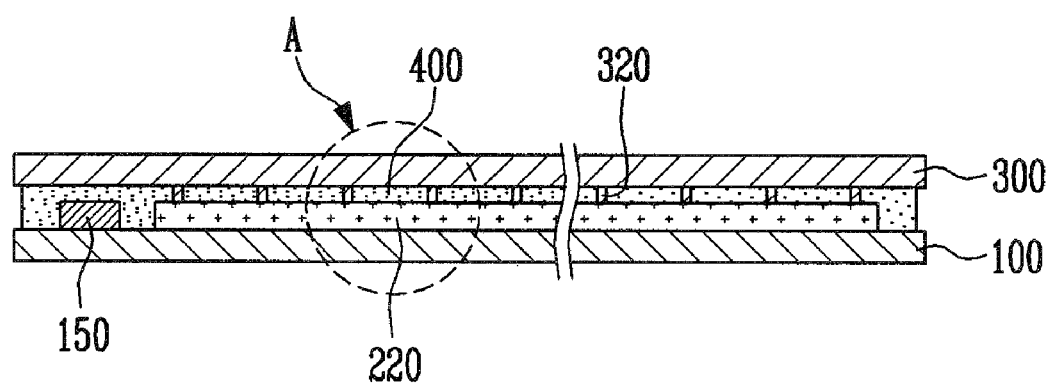
FIG. 2B is a simplified schematic cross-sectional view taken along the line I1-I2 of the organic light emitting display device of FIG. 1 according to another embodiment of the present invention.

FIG. 1 is a schematic plan view of an organic light emitting display device according to an embodiment of the present invention. FIG. 2A is a simplified schematic cross-sectional view taken along the line I1-I2 of the organic light emitting display device of FIG. 1 according to an embodiment of the present invention. FIG. 2B is a simplified schematic cross-sectional view taken along the line I1-I2 of the organic light emitting display device of FIG. 1 according to another embodiment of the present invention.

Referring to FIG. 1, a substrate 100 (e.g., a first substrate) includes a pixel region 110 and a non-pixel region 120. The non-pixel region 120 is a region surrounding the pixel region 110 or a region other than the pixel region 110.

The pixel region 110 of the substrate 100 includes a plurality of organic light emitting devices 220 connected between scan lines 130 and data lines 140 in a matrix. The non-pixel region 120 of the substrate 100 includes the scan lines 130 and data lines 140 extended from the pixel region 110, power supply lines configured to operate the organic light emitting devices 220, and a scan driver 150 and a data driver 160 configured to process signals externally provided to the scan driver 150 and the data driver 160 through pads 170 to supply the signals to the scan lines 130 and the data lines 140. The scan driver 150 and the data driver 160 include driving circuits configured to convert the signals externally provided through the pads 170 into scan signals and data signals selectively to drive the organic light emitting devices 220.

Referring to FIG. 2A, a sealing substrate 300 (e.g., the second substrate) is arranged to face the substrate 100 in order to seal the pixel region 110, and the sealing substrate 300 is bonded to the substrate 100 by sealing material 340. The sealing substrate 300 is shown in FIG. 2A as being over the substrate 100 with the organic light emitting device 220 therebetween. The sealing substrate 300 is configured to be separated from the substrate 100 by a predetermined distance utilizing a plurality of spacers 320 between the organic light emitting devices 220 and the sealing substrate 300. A plurality of fillers 400 are alternately arranged with the spacers 320 and configured to fill in space between the first substrate and the second substrate and the sealing material 340.

FIG. 2A shows the sealing material 340 between the substrate 100 and the sealing substrate 300 in order to surround the organic light emitting device 220. However, as shown in FIG. 2B, the organic light emitting device 220 is sealed by the filler 400 so that the substrate 100 may be bonded to the sealing substrate 300.

Figure 3:
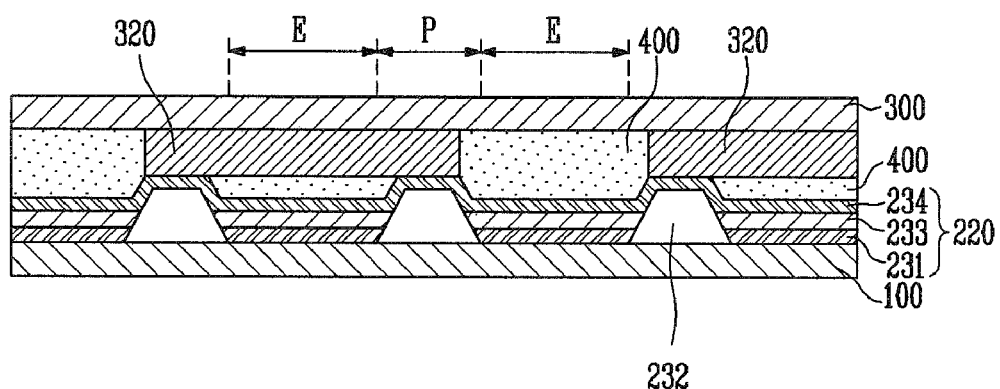
FIG. 3 is a cross-sectional view of portion A of the organic light emitting display devices of FIGS. 2A and 2B according to an embodiment of the present invention.

FIG. 3 is a cross-sectional view of portion A of the organic light emitting display devices of FIGS. 2A and 2B according to an embodiment of the present invention.

The organic light emitting devices 220 include a plurality of anode electrode 231 (e.g., first electrodes) on the substrate 100 (e.g., the first substrate), a plurality of pixel defining layers 232 on the substrate 100 alternatingly arranged with the anode electrodes 231 and defining light emitting regions E between successive ones of the pixel defining layers, a plurality of organic thin film layers 233 (e.g., organic light emitting layers) on the anode electrodes 231 oriented substantially on the light emitting regions E, and at least one cathode electrode 234 (e.g., second electrode) formed on the organic thin film layers 233 and the pixel defining layers 232. In an aspect, the spacers 320 contact the at least one cathode electrode 234 and the sealing substrate 300.

Figure 4:
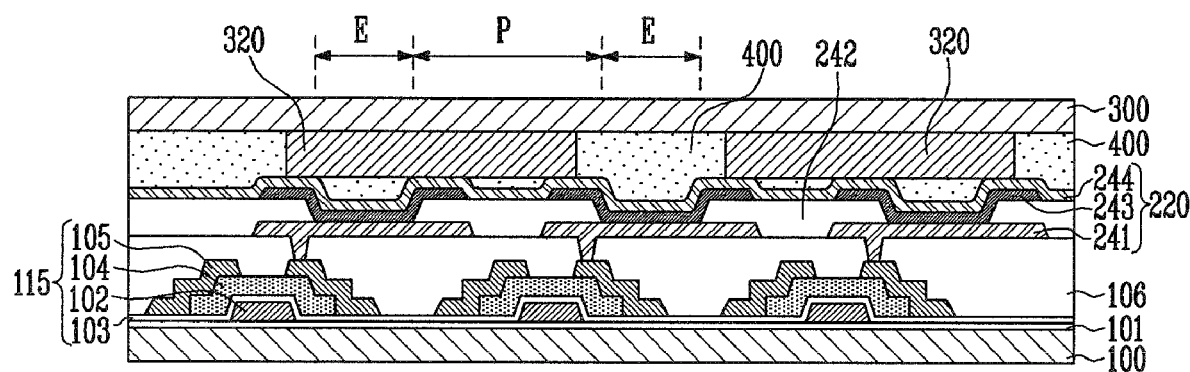
FIG. 4 is a cross-sectional view of portion A of the organic light emitting display devices of FIGS. 2A and 2B according to an embodiment of the present invention.
Figure 5A:
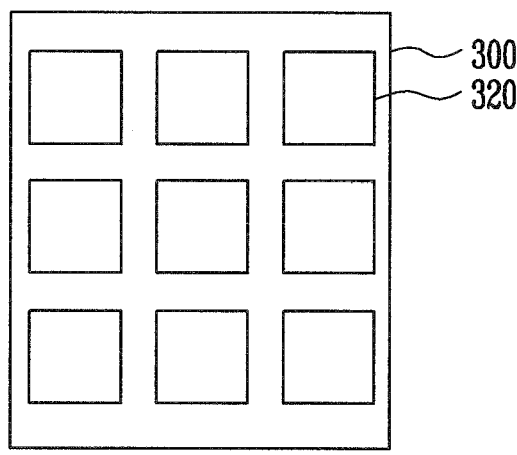
FIGS. 5A to 5H are plan views illustrating various arrangements of spacers according to embodiments of the present invention.
Figure 5B:
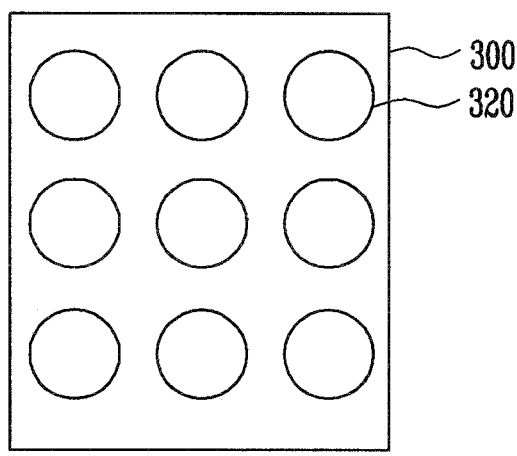
Figure 5C:
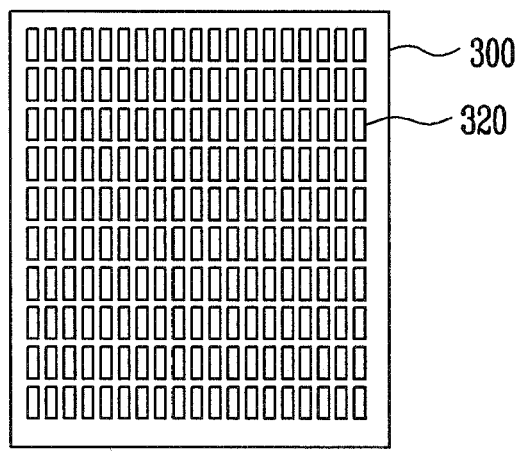
Figure 5D:
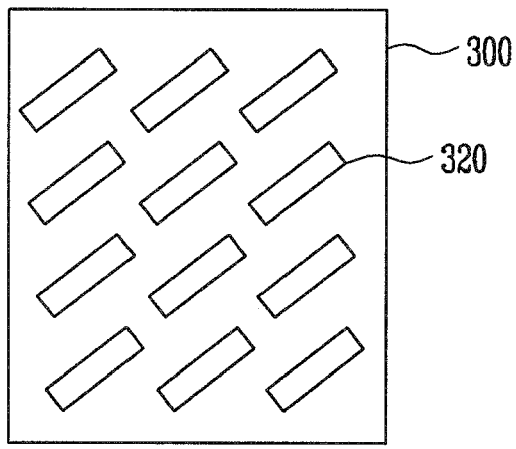
Figure 5E:
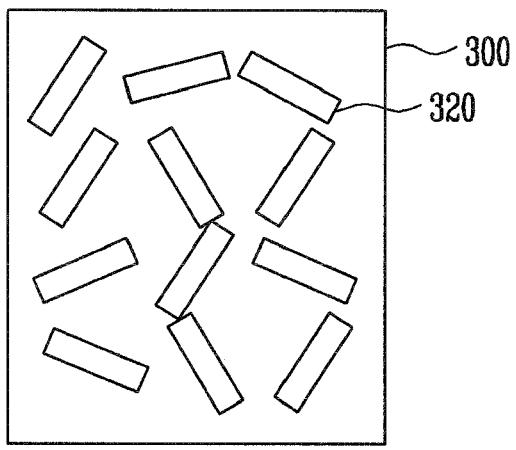
Figure 5F:
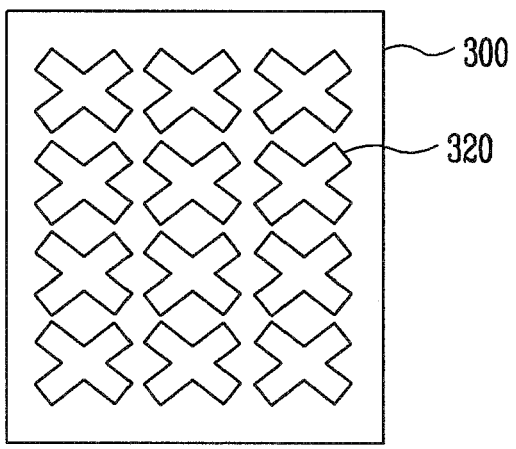
Figure 5G:
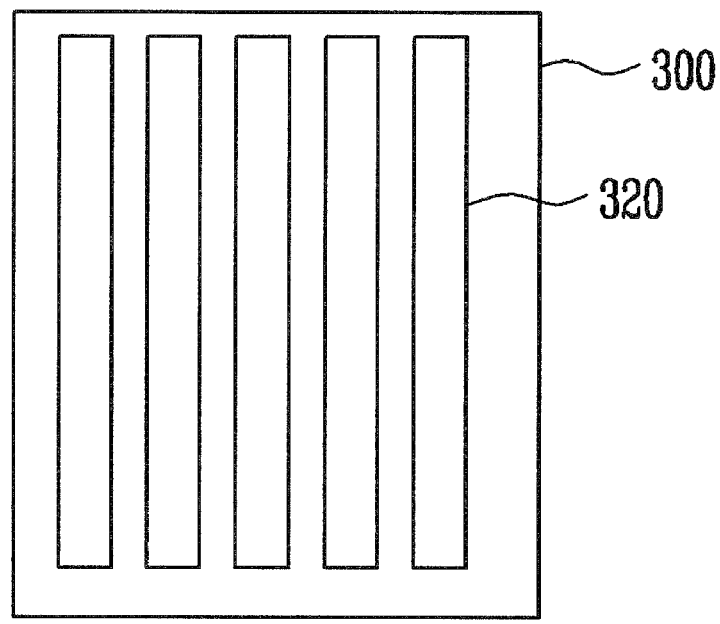
Figure 5H:
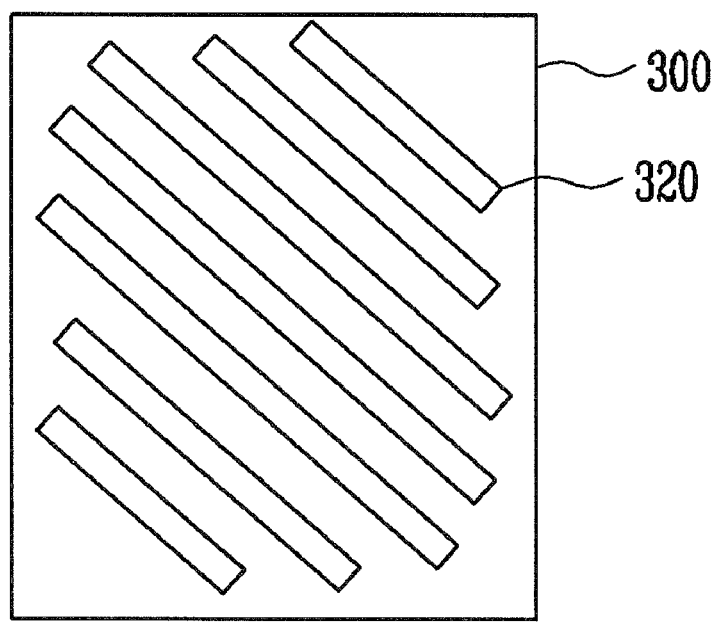

FIG. 4 is a cross-sectional view of portion A of the organic light emitting display devices of FIGS. 2A and 2B according to another embodiment of the present invention. A thin film transistor 115 for controlling an operation and a capacitor for maintaining signals are connected to the organic light emitting device 220. For convenience of explanation, only the organic light emitting device 220 and the thin film transistor 115 will be described.

The organic light emitting device 220 includes an anode electrode 241, a cathode electrode 244 and an organic thin film layer 243 between the anode electrode 241 and the cathode electrode 244. The organic thin film layer 243 is on the anode electrode 241 of the light emitting region E defined by space between successive ones of the pixel defining layers 242. The organic thin film layer 243 may include a hole injection layer, a hole transport layer, an electron transport layer, and an electron injection layer. The cathode electrode 244 is on the organic thin film layer 243 and the pixel defining layer 242.

The thin film transistor 115 includes a semiconductor layer 104 including a source region, a drain region and a channel region, a gate electrode 102 insulated from the semiconductor layer 104 by a gate insulating layer 103, and source and drain electrodes 105 coupled to the source and drain region of the semiconductor layer 104, wherein one of the source or drain electrode 105 is coupled to the anode electrode 241. Reference numerals 101 and 106, not explained, indicate a buffer layer 101 and a planarized insulating layer 106, respectively.

In the described embodiment, the spacers 320 and the fillers 400 are made of transparent materials that do not reduce light emitted from the organic light emitting devices 220 and do not lower visibility and image quality. The transparent materials are insulating materials having a transmittance between about 70 to 100% in a visible region, wherein a difference in a refractive index between the two materials is between about 0.01 to 0.4. For example, the spacers 320, which are made of transparent photosensitive resin having a refractive index of between about 1.3 to 1.7, contains a binder composition (resin having a weight-average molecular weight of about 1000 to 300000), a polymerizable compound, and a photopolymerization initiator. For example, the photosensitive resin is made of polyimide resin, silicon, epoxy, acrylate resin, diazo resin, azide resin, polyvinyl based resin, polyester resin, carboxyl based resin or a copolymer resin composition thereof. Also, the filler 400, which is transparent heat having a chemically high stability, electronic beam, or UV curing material, may be selected from epoxy, urethane acrylate, epoxy acrylate, bisphenol-A epoxy, cycloaliphatic epoxy resin, phenyl silicon resin, or a group consisting of rubber, acrylic epoxy resin and aliphatic urethane acrylate based resin, or silicon, or a group consisting of hexamethyldisiloxane, octamethyldisiloxane, decamethylpentasiloxane, dodecamethylpentasiloxane, and polydimethylsiloxane, as silicon oil.

As described above, the sealing technique of filling the space between the substrate and the sealing substrate 300 with the filler 400 can remarkably improve impact resistance in the organic light emitting display devices having a thin thickness. If there are no spacers 320 alternately arranged with the fillers 400, the distance between the substrate 100 and the sealing substrate 300 is not uniform, resulting in difficulty in maintaining a consistent amount of the fillers 400. Consequently, the fillers 400 may overflow, the sealing material 340 may collapse or the space between the substrates 100, 300 are not completely filled, etc. Therefore, the use of the spacers 320 together with the fillers 400 is indispensable in constantly maintaining the desired space between the substrate 100 and the sealing substrate 300 while improving the impact resistance of the organic light emitting display device.

If the spacers 320 are made of opaque material, the positions of the spacers 320 should be limited to the non-lighting regions such that the interval between spacers 320 corresponds to the pitch between the organic light emitting devices 220. Also, if a misalignment occurs when the substrate 100 is bonded to the sealing substrate 300, the size of the light emitting region is reduced or the spacers 320 cause emitted light to be reduced. Therefore, a process margin is increased when a high definition image (high density) display device is manufactured such that potential shading of the emitted light from the spacers 320 is reduced.

Therefore, in the described embodiment the spacers 320 and the fillers 400 are made of transparent materials having refractive indexes similar to each other to reduce or minimize the reduction of emitted light and the lowering of visibility and image quality such that the distance between the substrate 100 and the sealing substrate 300 is maintained constant. Although portions or all of the spacers 320 overlap with the light emitting regions E, that is, the widths of the spacers 320 are larger than the pitch P between the organic light emitting devices 220, lowering of the visibility and image quality from the shading of the spacers 320 does not occur. Accordingly, the positions of the spacers 320 are not limited to the non-light emitting region such that the process margin can be greatly improved when aligning the substrate 100 and the sealing substrate 300 during the manufacturing process.

FIGS. 5A to 5H are plan views illustrating various arrangements of spacers according to embodiments of the present invention, wherein the spacers 320 are formed on the sealing substrate 300 in the manufacturing process. For example, the spacer layers having a thickness of several μm to tens of μm are formed on the sealing substrate 300 using a spin coating method, a slit coating method, and a printing method, and then are patterned using a photographic method and an etching method, thereby making it possible to form spacers 320 in diverse shapes.

The spacers 320 may be formed in circular or quadrangular dot shapes (FIGS. 5A, 5B and 5C), rectangular dot shape (FIGS. 5D, 5E, and 5F), and stripe shapes (FIGS. 5G and 5H), etc. Such arranged positions are not limited to the non-light emitting region such that the spacers 320 may be arranged irregularly. Also, the spacers 320 may be formed in hemispherical shapes or trapezoid shapes having an upper cross-section smaller than a lower cross-section in order to minimize the contact area with the cathode electrodes 234 and 244.

While the present invention has been described in connection with certain exemplary embodiments, it is to be understood that the invention is not limited to the disclosed embodiment, but, on the contrary, is intended to cover various modifications and equivalent arrangements included within the spirit and scope of the appended claims, and equivalents thereof.

What is claimed is:

1. An organic light emitting display device comprising:
   a first substrate;
   a plurality of organic light emitting devices on the first substrate, the organic light emitting devices comprising:
      a plurality of first electrodes on the first substrate;
      a plurality of organic light emitting layers on the first electrodes; and
      at least one second electrode on the organic light emitting layers;
   a second substrate arranged opposite and substantially parallel to the first substrate with the organic light emitting devices therebetween;
   a plurality of spacers between the organic light emitting devices and the second substrate; and
   a plurality of fillers alternately arranged with the spacers and configured to fill in space between the first substrate and the second substrate,
   wherein at least portions of the spacers overlap with a plurality of light emitting regions defined by the organic light emitting layers and the first electrodes,
   wherein the spacers and fillers contact the at least one second electrode, and
   wherein the spacers and the fillers have a transmittance between about 70% to 100%, and a difference in a refractive index between the spacers and the fillers is between about 0.01 to 0.4.

2. The organic light emitting display device according to claim 1, wherein the spacers are on the second substrate.

3. The organic light emitting display device according to claim 1, wherein a width of the spacers is greater than an interval between the organic light emitting devices.

4. The organic light emitting display device according to claim 1, wherein the refractive index of the spacers is between about 1.3 to 1.7.

5. The organic light emitting display device according to claim 4, wherein the spacers comprise photosensitive resin.

6. The organic light emitting display device according to claim 5, wherein the photosensitive resin comprises a binder composition, a polymerizable compound, and a photopolymerization initiator.

7. The organic light emitting display device according to claim 5, wherein the photosensitive resin is made of polyimide resin, silicon, epoxy, acrylate resin, diazo resin, azide resin, polyvinyl based resin, polyester resin, or carboxyl based resin.

8. The organic light emitting display device according to claim 1, further comprising a plurality of pixel defining layers on the first substrate alternatingly arranged with the first electrodes,
   wherein the at least one second electrode is on the pixel defining layers, and
   wherein the spacers contact the second substrate.

9. The organic light emitting display device according to claim 8, further comprising:
   a thin film transistor connected to each of the first electrodes.

10. The organic light emitting display device according to claim 9, wherein the thin film transistor comprises:
    a semiconductor layer including a source region, a drain region and a channel region;
    a gate electrode insulated from the semiconductor layer by a gate insulating layer; and
    a source electrode coupled to the source region of the semiconductor layer and a drain electrode coupled to the drain region of the semiconductor layer,
    wherein one of the source electrode or the drain electrode is coupled to corresponding one of the first electrodes.

11. The organic light emitting display device according to claim 1, wherein the first substrate is bonded to the second substrate utilizing the fillers.

12. The organic light emitting display device according to claim 1, further comprising:
    a sealing material between the first substrate and the second substrate configured to surround the organic light emitting devices.

* * * * *